(12) United States Patent
Choy et al.

(10) Patent No.: US 7,849,896 B2
(45) Date of Patent: Dec. 14, 2010

(54) BONDHEAD ALIGNMENT TOOL FOR A BONDING APPARATUS

(75) Inventors: Ping Kong Joseph Choy, Kwai Chung (HK); Chung Sheung Tate Yung, Kwai Chung (HK); Ju Fan, Kwai Chung (HK); Hon Yu Peter Ng, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 357 days.

(21) Appl. No.: 12/037,335

(22) Filed: Feb. 26, 2008

(65) Prior Publication Data

US 2009/0211709 A1    Aug. 27, 2009

(51) Int. Cl.
B32B 41/00    (2006.01)
(52) U.S. Cl. .................. 156/351; 156/358; 156/360
(58) Field of Classification Search ................ 156/351, 156/358, 360; 73/1.15, 862.381
See application file for complete search history.

(56) References Cited

U.S. PATENT DOCUMENTS

| 6,179,938 | B1 | 1/2001 | Mannhart et al. |
| 6,990,867 | B2 | 1/2006 | Okada |
| 7,066,373 | B2 | 6/2006 | Behler |
| 7,240,711 | B2 | 7/2007 | Chan et al. |
| 2004/0159166 | A1* | 8/2004 | Schiller ................. 73/862.381 |
| 2004/0187593 | A1* | 9/2004 | Okada ......................... 73/780 |
| 2005/0155712 | A1* | 7/2005 | Chan et al. .................. 156/351 |

* cited by examiner

Primary Examiner—George R Koch, III
(74) Attorney, Agent, or Firm—Ostrolenk Faber LLP

(57) ABSTRACT

An alignment tool for a bonding apparatus comprises a loading surface for receiving a pushing force from a surface of a device which is attached to the bonding apparatus, the loading surface being arranged and constructed to experience a tilting moment upon receiving an unequally distributed pushing force from a misaligned device acting on it. The loading surface transmits the tilting moment experienced by it to a sensing surface which is operatively connected to the loading surface through a columnar body, which has a smaller width than the loading surface and the sensing surface, and which connects the loading surface and the sensing surface. An array of piezoelectric elements communicates with the sensing surface and produces electrical signals in response to the tilting moment such that a computing unit operatively connected to the piezoelectric elements may detect a direction of tilt of the loading surface from the electrical signals produced by the piezoelectric elements.

20 Claims, 4 Drawing Sheets

BONDHEAD ALIGNMENT TOOL FOR A BONDING APPARATUS

FIELD OF THE INVENTION

The invention relates to bonders for electronic devices, and in particular to an alignment tool for aligning a bondhead of a bonding apparatus such as a die bonder.

BACKGROUND AND PRIOR ART

A die bonder is an apparatus that picks a semiconductor chip or die from a loader and places it onto a carrier such as a lead frame. To ensure the quality and reliability of subsequent processes performed on the die, a bondhead of the die bonder should be aligned with respect to a supporting surface of the lead frame such that the die it picks up is plane-parallel to the supporting surface within several tenths of an arcsecond even when there is a load on the bondhead. Alignment is also important to reduce the risk of the fragile semiconductor die cracking. Therefore, the bondhead is designed to be adjustable to tilt with respect to the supporting surface in order to align it with the supporting surface.

Typically, there are two methods for aligning a bondhead with respect to a supporting surface. These are the contact and the non-contact methods. FIG. 1 illustrates a contact type alignment tool 100 that has a bondhead 12 with a circular-rimmed ruler 14 mounted at one end of the bondhead 12. The ruler 14 presses onto a piece of carbon paper that is placed onto a supporting surface 16. If the ruler 14 is misaligned with respect to the supporting surface 16, an incomplete circle will appear on the carbon paper. The bondhead 12 is then adjusted until a complete circle appears when the ruler's bottom surface is parallel to the supporting surface 16, which then indicates a proper alignment of the bondhead 12 with respect to the supporting surface 16. This circular ruler 14 simulates a collet of the bondhead impacting the supporting surface during pick and place operations on a die. However, the impact condition of the circular ruler 14 on the support surface deviates from the actual pick and place process. Furthermore, it is time consuming to adjust the tilting of the circular ruler 14 using an incomplete circle as a gauge.

FIG. 2 shows another contact type method of aligning the bondhead 12 with respect to the supporting surface 16 which is discussed in more detail in U.S. Pat. No. 7,066,373 entitled "Method For Aligning The Bondhead Of A Die Bonder". A contact needle 18 is used to determine the actual tilt of a die 20 during the pick and place process. The die 20 is first picked up by the bondhead 12 before touching the needle 18. The corresponding vertical position of the bondhead 12 is read by the encoder as Z1. The vertical positions of at least two more points, Z2 and Z3, are measured to determine the tilt of the die 20 relative to the supporting surface 16 using a simple geometric relation. This method of alignment is simple and can align the bondhead with the die 20 to several tenths of a micron. However, the eccentric point loading on the die 20 cannot reflect impact conditions on the contact surface during actual pick and place operations on the die.

FIG. 3 illustrates a non-contact method of alignment which is also disclosed in U.S. Pat. No. 6,179,938 entitled "Method And Apparatus For Aligning The Bonding Head Of A Bonder, In Particular A Die Bonder". In this method, a non-contact sensor 22 determines the tilting angle of the bondhead 12. The bondhead 12 picks up a ferromagnetic or reflective die 20 and places it on the non-contact sensor 22 such as a calibrated magnetic or optical measuring device. The accuracy of detection of the tilting angle depends on the type of sensor used. As this is a non-contact method, it cannot determine the surface loading effect when the bondhead 12 places the die 20 onto a surface, which potentially may cause the die 20 to crack.

The sensors 22 for the above described non-contact method can be in the form of force measurement sensors developed for measuring moments acting on the corresponding load surfaces, such as that disclosed in the U.S. Pat. No. 6,990,867 entitled "Force Detection Device", wherein multiple capacitive displacement sensors are attached to the surfaces of two box-like structures to measure forces and moments. Although the invention disclosed in this prior art can measure up to three forces and three moment components, the square structure of the apparatus and the large number of sensors required render the apparatus complicated to use and to manufacture. It is therefore desirable to devise a simple, fast and accurate method of adjusting the alignment of the bondhead in relation to the supporting surface.

SUMMARY OF THE INVENTION

It is thus an object of the invention to seek to provide an alignment apparatus which can simulate a contact surface loading during actual die bonding operations and provides a fast and simple means of aligning a bondhead in the presence of such contact surface loading.

Accordingly, the invention provides an alignment tool for a bonding apparatus, comprising: a loading surface for receiving a pushing force from a surface of a device attached to the bonding apparatus, and which is arranged and constructed to experience a tilting moment upon receiving an unequally distributed pushing force from a misaligned device acting on it; a sensing surface operatively connected to the loading surface to which the tilting moment experienced by the loading surface is transmitted; a columnar body having a smaller width than the loading surface and the sensing surface which connects the loading surface and the sensing surface; an array of piezoelectric elements in communication with the sensing surface which produce electrical signals in response to the tilting moment; and a computing unit operatively connected to the piezoelectric elements to detect a direction of tilt of the loading surface from the electrical signals produced by the piezoelectric elements.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of one preferred embodiment of the invention when considered with the accompanying drawings, in which.

DETAILED DESCRIPTION OF THE DETAILED EMBODIMENT OF THE INVENTION

Figure 1:
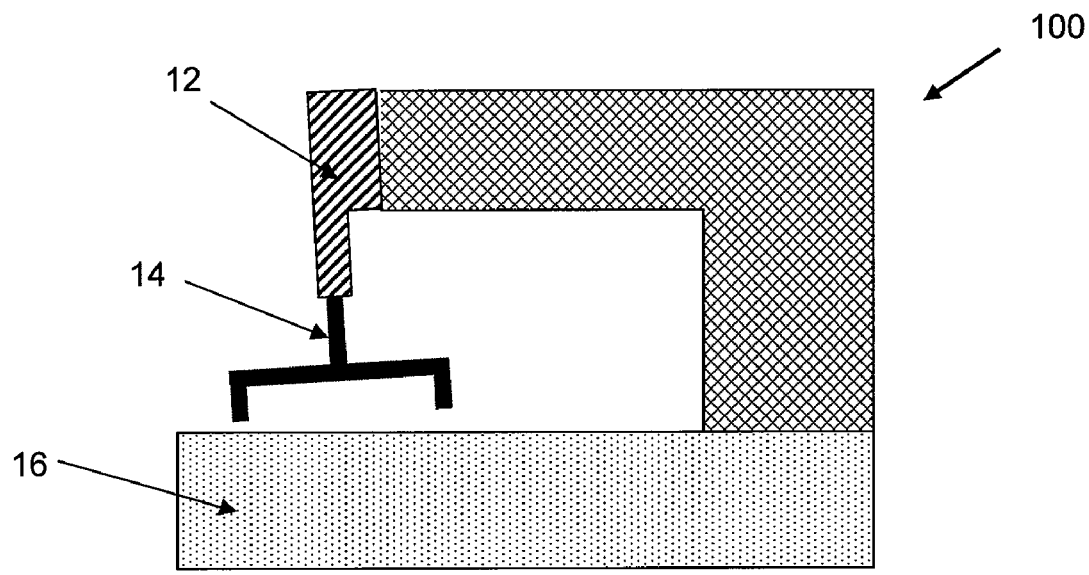
FIG. 1 is a side view of a prior art bondhead alignment tool using a circular-rimmed ruler.
Figure 2:
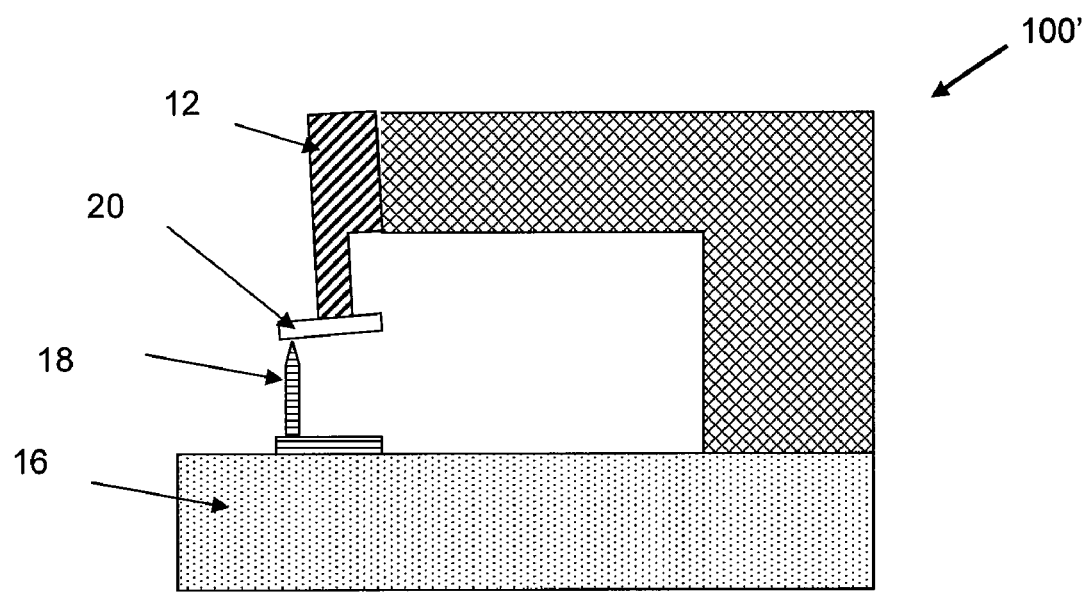
FIG. 2 is a side view of a prior art bondhead alignment tool using a contact needle.
Figure 3:
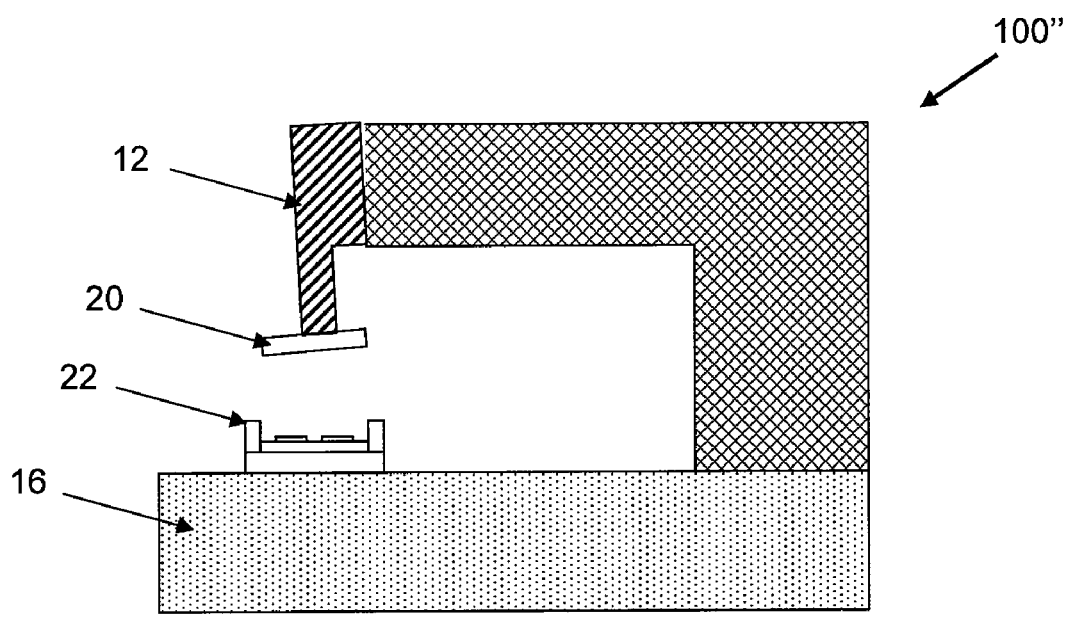
FIG. 3 is a side view of a prior art bondhead alignment tool using a ferromagnetic or a reflective die and a calibrated magnetic or optical measuring device.
Figure 4:
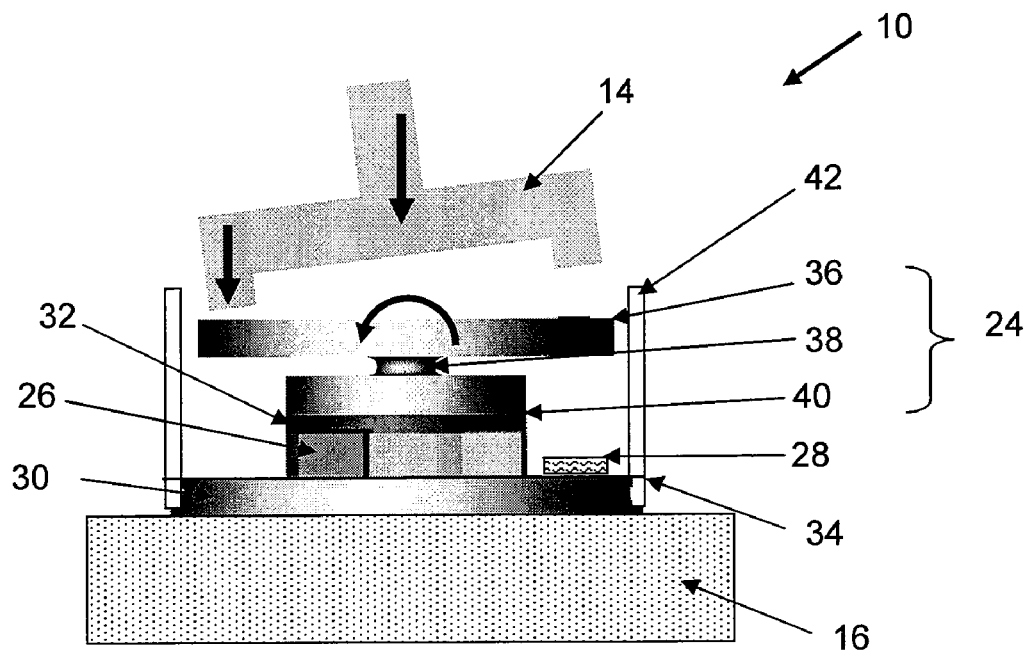
FIG. 4 is a side view of a bondhead alignment tool according to the preferred embodiment of the invention.

FIG. 4 is a side view of a bondhead alignment tool 10 for determining an alignment of a bondhead 12 relative to a supporting surface 16 according to the preferred embodiment of the invention. The alignment tool 10 is positioned on the supporting surface 16 and below a device which is attached to the bondhead 12, such as a circular-rimmed ruler 14. The alignment tool 10 generally comprises a mechanical converter 24, a polar array of piezoelectric elements 26 and a computing unit 52.

The mechanical converter 24 includes a sensing surface 40 and a loading surface 36 which are operatively connected to each other. The mechanical converter 24 further comprises a columnar body, which may be in the form of a concave column 38 having a substantially concave outside surface. The concave column 38 preferably connects the loading surface 36 and the sensing surface 40 to form a substantially one piece I-shaped metallic structure.

The mechanical converter 24 is preferably made of a material which provides a high yield to elastic modulus ratio. It can be made of materials such as spring steel, stainless steel, copper, aluminum, ferrous alloy or titanium alloy. The loading surface 36 may be further insulated or coated by a thin layer of insulating material like thermoplastic or thermoset. The loading surface 36 which receives a pushing force from a surface of the ruler 14 and the sensing surface 40 which communicates with the piezoelectric elements 26 are preferably plane parallel. The sensing surface 40 that is in contact with the piezoelectric elements 26 is also grounded to maintain good mechanical coupling to the piezoelectric elements 26.

The piezoelectric elements 26 communicate with the sensing surface 40 and are also operatively connected to the computing unit 52 so that a direction of tilt of the loading surface 36 can be detected by the computing unit 52 from the electrical signals produced by the piezoelectric elements 26. The alignment tool 10 further comprises an electronic circuit 28 which is connected between the piezoelectric elements 26 and the computing unit 52 (see FIG. 6). Located in between the sensing surface 40 and the piezoelectric elements 26 is a ground electrode 32, which may consist of a conductive material such as spring steel, stainless steel, copper, aluminum or titanium alloy. The ground electrode 32 is designed to have a contact surface facing the piezoelectric elements 26 that is of the same shape as the piezoelectric elements 26. The sensing surface 40 relieves stress concentration by pressing the piezoelectric elements 26 against the sensing surface 40. Thus, the top and bottom surfaces of the ground electrode 32 are plane parallel and ground with the sensing surface 40 of the mechanical converter 24.

A printed circuit 34 is located between the piezoelectric elements 26 and a base 30 of the bondhead alignment tool 10. The ground electrode 32, piezoelectric elements 26, and printed circuit 34 are preloaded together by the sensing surface 40 and the base 30. Electrical signals from the electronic circuit 28 and the printed circuit 34 are input to the computing unit 52 to reflect the in-plane magnitude and direction of tilt of the loading surface 36 under a contact load.

The electronic circuit 28, which is located on the base 30 next to the foot of the piezoelectric elements 26, is responsible for conditioning electrical signals received from the piezoelectric elements 26 before feeding them to the computing unit 52. The electronic circuit 28 is located inside the alignment tool 10 such that it is shielded from electromagnetic noise by a metallic casing 42, the mechanical converter 24 and the base 30. The metallic casing 42 preferably substantially surrounds the loading surface 36, sensing surface 40 and piezoelectric elements 26.

During the alignment process, a bottom surface of a circular ruler 14 exerts a pushing force acting on the loading surface 36 of the mechanical converter 24. When the ruler 14 is misaligned, the pushing force is unequally distributed on the loading surface 36 such that the loading surface 36 experiences a tilting moment having a magnitude M and a certain tilt angle $\theta$. The tilting moment experienced by the loading surface 36 is also experienced by the concave column 38. The concave column 38 has a smaller width or diameter than the loading surface 36 and the sensing surface 40 to allow adequate compliance and flexibility for bending, in order to attain a large tilt angle $\theta$ to moment M ratio. The tilting moment on the concave column 38 is transmitted to the sensing surface 40 which then exerts a corresponding force on the piezoelectric elements 26. The piezoelectric elements 26 produce electrical signals in response to the magnitude of the tilting moment experienced. In this way, as the moment acting on the concave column 38 is transmitted to the piezoelectric elements 26, the electrical output of the piezoelectric elements 26 indicates the tilt angle of the ruler 14 when the ruler 14 pushes on the loading surface 36.

The piezoelectric elements 26 are configured to react to the moments experienced such that a summation of moments experienced by the piezoelectric elements 26 generates electrical charge signals which are interpreted and evaluated using the computing unit 52. The electrical charge signals indicate a magnitude and direction of tilt of the loading surface 36 which correspond to the magnitude and direction of tilt of the ruler 14, as well as the surface contact impact conditions.

The concave column 38 provides a designated level of compliance such that the mechanical converter 24 is operative to convert the contact force to a moment having a magnitude M to the piezoelectric elements 26 at a certain tilt angle $\theta$. This compliance is determined by the diameter $D_{column}$, height H, and elastic modulus E of the concave column 38 with the relationship:

$$D_{column} = \sqrt[4]{\frac{64MH}{\pi\theta E}}.$$

At a certain tilt angle $\theta$, the electric signals, which are the charge signals generated by the piezoelectric elements 26, indicate a corresponding magnitude and direction of tilt of the loading surface 36. These charge signals are relayed to the electronic circuit 28 for signal conditioning. As the electric signals after signal conditioning has a full range of magnitude, the optimal gain of the electronic circuit 28, the material properties of the piezoelectric elements 26 to be chosen, the full range of measurable tilt angles $\theta$, and the corresponding dimensions of the concave column 38, loading surface 36 and sensing surface 40 can be determined.

Figure 5:
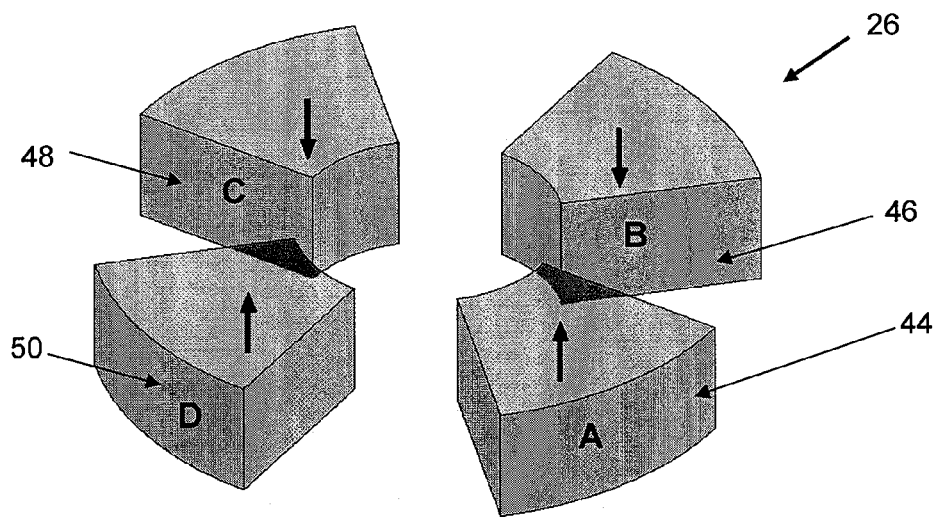
FIG. 5 shows an arrangement and polarity of piezoelectric elements of the bondhead alignment tool according to the preferred embodiment of the invention.

FIG. 5 shows an arrangement and polarity of piezoelectric elements 26 of the bondhead alignment tool according to the preferred embodiment of the invention. The piezoelectric material can be made of any sensor-type piezoelectric materials containing lead, titanate or quartz. The piezoelectric elements may comprise a piezoelectric ring which is divided into sectors substantially evenly in a circular fashion as shown in FIG. 5. Preferably, there are at least two separate piezoelectric sectors divided from the piezoelectric ring. In the illustrated embodiment, a total of four piezoelectric sectors 44, 46, 48 and 50 are used to form the piezoelectric elements 26. The plurality of the piezoelectric sectors is divided evenly such that the polarities of two adjacent piezoelectric sectors are arranged in the opposite direction to the polarities of the two other piezoelectric sectors. Specifically, first and second piezoelectric sectors 44, 48 are of opposite polarities and third and fourth piezoelectric sectors 46, 50 are of opposite polarities.

The piezoelectric elements 26 are preloaded between the printed circuit 34 and ground electrode 32 using the sensing surface 40 and base 30 such that the upper surface of each of the piezoelectric elements 26 as shown are short circuited together with another piezoelectric sector and all the piezoelectric sectors are preloaded compressively. This preload allows the piezoelectric elements 26 to exhibit bipolar signal generation. Under this configuration, the in-plane tilt direction and magnitude can be calculated using the electronic circuit 28 together with the computing unit 52.

Figure 6:
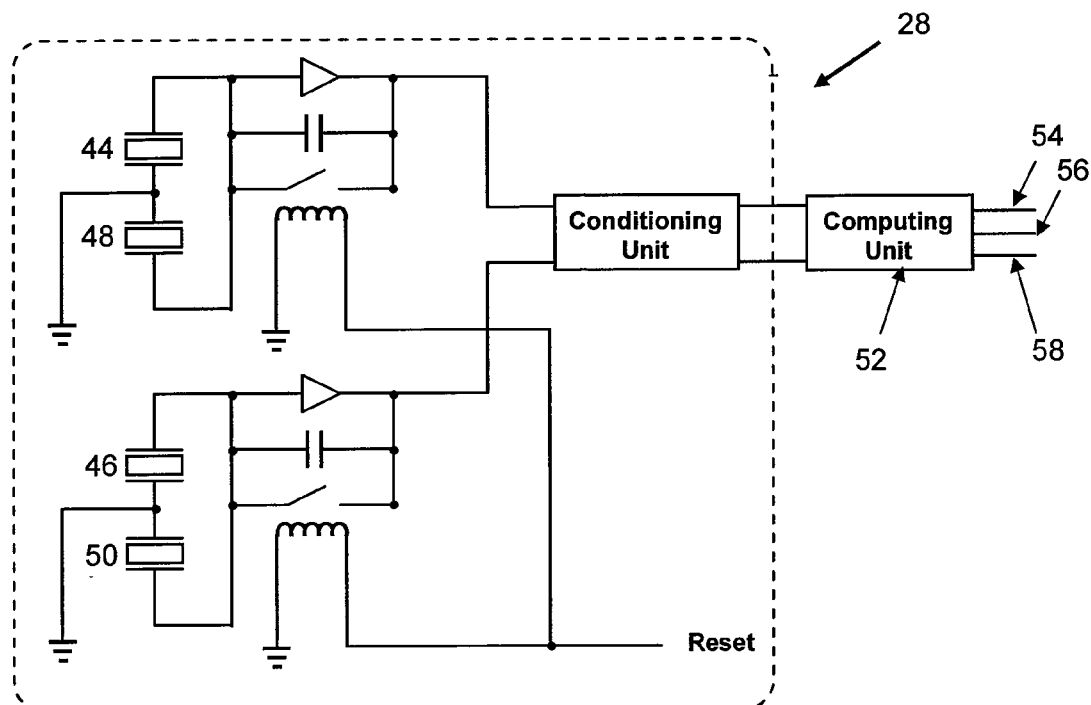
FIG. 6 shows a circuit diagram of an exemplary electronic circuit for connecting the piezoelectric elements to a computing unit according to the preferred embodiment of the invention.

FIG. 6 shows a circuit diagram of an exemplary electronic circuit 28 for connecting the piezoelectric elements 26 to a computing unit 52 according to the preferred embodiment of the invention. The electronic circuit 28 comprises a common charge amplifier circuit with reed relays which are added to short circuit the capacitors. The first and second piezoelectric sectors 44, 48 and the third and fourth piezoelectric sectors 46, 50 are short circuited using the ground electrode 32. When the moment caused by the contact load is applied to the piezoelectric elements 26, for example, about an axis joining the first and second piezoelectric sectors 44, 48 in the A-C direction, compression and tension occur at the third and fourth piezoelectric sectors 46, 50 respectively in the B-D direction. Since the polarity of the third and fourth piezoelectric sectors 46, 50 are opposite, the compression and tension at these piezoelectric sectors 46, 50 have the same sign in the charge signal transmitted to the amplifier of the electronic circuit 28. This configuration of the piezoelectric sectors inherently adds up the charge signals through parallel electrical connection to provide a significant charge for an amplifier operation. However, the charge generation due to the moments acting on the first and second piezoelectric sectors 44, 48, are cancelled individually. When the moment acts on the first and second piezoelectric sectors 44, 48, one of the piezoelectric sectors bears a tension load and the other piezoelectric sector is compressed by the same magnitude. As a result, no net charge is generated at the piezoelectric sectors 44, 48 lying along the axis of the moment. Only signals due to a moment generated by a net directional point load at the loading surface 36 will be detected.

The charge signal coming from each pair of piezoelectric sectors is related to the moment arising from the contact force by the formulas: $\Delta V_{A-C}=2gd_{33}k_p r_p \theta_{A-C}$ and $\Delta V_{B-D}=2gd_{33}k_p r_p \theta_{B-D}$ where $\Delta V_{A-C}$ is the charge signal from the first and second piezoelectric sectors 44, 48, $\Delta V_{B-D}$ is the charge signal from the third and fourth piezoelectric sectors 46, 50, g is the gain of the amplifier of the electronic circuit 28, $d_{33}$ is the piezoelectric constant of the piezoelectric elements 26, $r_p$ is the mean radius of the piezoelectric elements 26, and $\theta_{A-C}$ and $\theta_{B-D}$ are the tilt angle components of the mechanical converter 34 on the first and second piezoelectric sectors 44, 48 in the A-C direction, and the third and fourth piezoelectric sectors 46, 50 in the B-D direction respectively. By normalizing the charge signals $\Delta V_{A-C}$ and $\Delta V_{B-D}$, the magnitude of tilt ($\hat{V}$) and direction of tilt ($\phi$) can be computed using $\hat{V}=\sqrt{\Delta V_{A-C}^2 + \Delta V_{B-D}^2}$ and $$\phi = \arctan\left(\frac{\Delta V_{A-C}}{\Delta V_{B-D}}\right),$$

where $\Delta V_{A-C}$ and $\Delta V_{B-D}$ correspond to the tilt magnitude signal outputs 54 and 56 respectively of the computing unit 52. A position encoder also outputs a position signal 58 for determining a vertical position (z) of the ruler 14 at any given time.

Figure 7A:
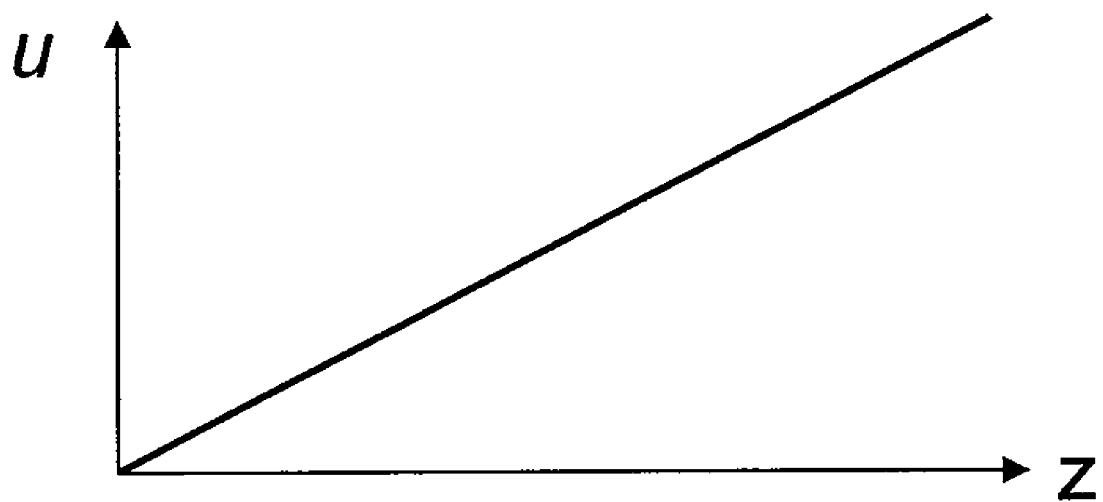
FIGS. 7A and 7B are graphical representations of the relationship between a load exerted on a loading surface of the alignment tool and a tilting angle of the loading surface resulting from changes to vertical positions of a ruler exerting the load.
Figure 7B:
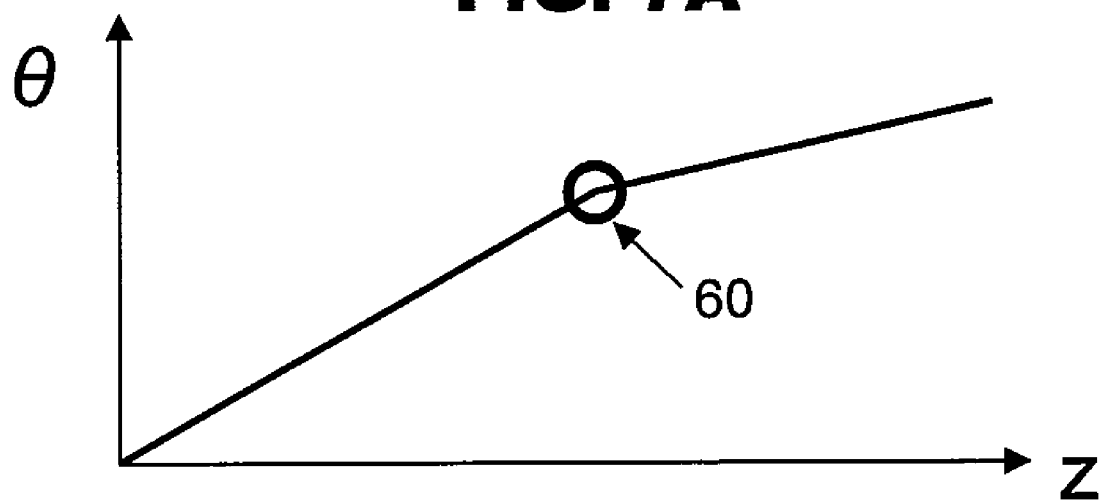

FIGS. 7A and 7B are graphical representations of the relationship between a load u exerted on a loading surface 36 of the alignment tool 10 and a tilting angle $\theta$ of the loading surface 36 resulting from changes to vertical positions z of a ruler exerting the load. The direction and magnitude of tilt can be obtained using the alignment tool 10 according to the preferred embodiment of the present invention and signals received by the computing unit 52. The contact load u for determining the tilt information may damage the present alignment tool if the contact load u keeps increasing without any control during alignment. To locate when to stop increasing the load u, FIG. 7B read with FIG. 7A shows the tilt magnitude profile when the contact load u increases with incremental lowering of the ruler 14 (denoted by its vertical position, z) onto the loading surface 36. As the load u increases, the ruler 14 increases the tilt angle $\theta$ of the loading surface 36 which in turn increases the electric signal generated by the piezoelectric elements 26.

The load u increases until a vertical position of the ruler 14 at which the entire rim of the ruler 14 eventually contacts the loading surface 36. At this point, the tilt angle of the loading surface 36 and the circular ruler 14 are the same. The loading on the loading surface 36 changes from a contact point load to a surface load, which is an axial load on the alignment tool 10. The rate of change of the tilt magnitude $\theta$ experiences a substantial reduction as indicated at point 60 in FIG. 7B, so that there is a decrease in the slope of the graphical profile. At this time, the ruler 14 stops applying a load onto the loading surface 36 of the alignment tool by stopping the ruler at the vertical position z near to point 60 as provided by the position signal 58 illustrated in FIG. 6. At this point, the magnitude and direction of tilt of the ruler 14 may be measured.

It would be appreciated that the preferred embodiment of the invention provides a scaled alignment tool 10 which reduces the time required for adjusting the alignment of a bondhead 12 relative to a supporting surface 16. The alignment tool 10 is able to simulate actual loading on the bondhead 12 by the supporting surface 16 during bonding. Accordingly, the electric signals generated by the piezoelectric elements 26 are proportional to the contact load. From the resulting tilt magnitude profile, an operator knows the extent of adjustment needed to align the bondhead to the supporting surface within an acceptable range. Therefore, there is no blind searching during the alignment process as in the prior art. Furthermore, due to the contact type alignment used in this method, the bondhead 12 can be aligned to the supporting surface 16 even if the bondhead mounting tends to be deformed under the contact load.

The invention described herein is susceptible to variations, modifications and/or additions other than those specifically described and it is to be understood that the invention includes all such variations, modifications and/or additions which fall within the spirit and scope of the above description.

The invention claimed is:

1. An alignment tool for a bonding apparatus, comprising:
   a loading surface for receiving a pushing force from a surface of a device attached to the bonding apparatus, and which is arranged and constructed to experience a tilting moment and a first tilt angle upon receiving an unequally distributed pushing force from a misaligned device acting on it;
   a sensing surface operatively connected to the loading surface to which the tilting moment experienced by the loading surface is transmitted;
   a columnar body having a smaller width than the loading surface and the sensing surface which connects the loading surface and the sensing surface, the columnar body being elastic and configured to bend from the tilting moment so as to attain a second tilt angle that is larger than the first tilt angle and to magnify a tilt angle sensed by the sensing surface;
   an array of piezoelectric elements in communication with the sensing surface which produce electrical signals in response to the tilting moment; and
   a computing unit operatively connected to the piezoelectric elements to detect a direction of tilt of the loading surface from the electrical signals produced by the piezoelectric elements.

2. The alignment tool as claimed in claim 1, further comprising a ground electrode located between the sensing surface and the array of piezoelectric elements.

3. The alignment tool as claimed in claim 2, wherein the ground electrode has a contact surface facing the piezoelectric elements that is of the same shape as the array of piezoelectric elements.

4. The alignment tool as claimed in claim 2, further comprising a printed circuit located between the piezoelectric elements and a base of the alignment tool.

5. The alignment tool as claimed in claim 4, wherein the ground electrode, piezoelectric elements and printed circuit are preloaded together by the sensing surface and the base.

6. The alignment tool as claimed in claim 1, further comprising an electronic circuit connected between the piezoelectric elements and the computing unit for conditioning electrical signals received from the piezoelectric elements before feeding them to the computing unit.

7. The alignment tool as claimed in claim 1, wherein the columnar body has a substantially concave outside surface.

8. The alignment tool as claimed in claim 1, wherein the loading surface, columnar body and sensing surface form a substantially I-shaped structure.

9. The alignment tool as claimed in claim 8, wherein the substantially I-shaped structure comprises a one-piece metallic structure.

10. The alignment tool as claimed in claim 1, wherein the columnar body is flexible.

11. The alignment tool as claimed in claim 10, wherein the loading surface, columnar body and sensing surface are made of a material which provides a high yield to elastic modulus ratio.

12. The alignment tool as claimed in claim 11, wherein the material is selected from the group consisting of: spring steel, stainless steel, copper, aluminum, ferrous alloy and titanium alloy.

13. The alignment tool as claimed in claim 1, wherein a surface of the loading surface receiving the pushing force and a surface of the sensing surface that is in communication with the piezoelectric materials are plane parallel.

14. The alignment tool as claimed in claim 1, further comprising a metallic casing substantially surrounding the loading surface, sensing surface and piezoelectric elements.

15. The alignment tool as claimed in claim 1, wherein the piezoelectric elements comprise at least two separate piezoelectric units.

16. The alignment tool as claimed in claim 15, wherein the piezoelectric elements are configured to react to moments experienced such that a summation of moments experienced by the piezoelectric elements generates electrical charge signals which indicate a magnitude and direction of tilt of the device attached to the bonding apparatus.

17. The alignment tool as claimed in claim 15, wherein the piezoelectric elements comprise a piezoelectric ring which is divided substantially evenly in a circular fashion into four piezoelectric units and the polarities of two adjacent piezoelectric units are arranged in the opposite direction to the polarities of the two other piezoelectric units.

18. The alignment tool as claimed in claim 15, wherein one surface of each of the piezoelectric units is short circuited together with another piezoelectric unit and all the piezoelectric units are preloaded compressively.

19. The alignment tool as claimed in claim 1, further comprising a thin layer of insulating material coating the loading surface.

20. An alignment tool for a bonding apparatus, comprising:
   a loading surface for receiving a pushing force from a surface of a device attached to the bonding apparatus, and which is arranged and constructed to experience a tilting moment and a first tilt angle upon receiving an unequally distributed pushing force from a misaligned device acting on it;
   a sensing surface operatively connected to the loading surface to which the tilting moment experienced by the loading surface is transmitted;
   a columnar body having a smaller width than the loading surface and the sensing surface which connects the loading surface and the sensing surface, the columnar body having a level of compliance and flexibility for bending so as to attain from the tilting moment a second tilt angle that is larger than the first tilt angle and to magnify a tilt angle sensed by the sensing surface, the level of compliance being determined by the diameter, height, and elastic modulus of the columnar body;
   an array of piezoelectric elements in communication with the sensing surface which produce electrical signals in response to the tilting moment; and
   a computing unit operatively connected to the piezoelectric elements to detect a direction of tilt of the loading surface from the electrical signals produced by the piezoelectric elements.

* * * * *